United States Patent
Pan

(10) Patent No.: US 7,848,453 B2
(45) Date of Patent: Dec. 7, 2010

(54) INDEPENDENT LO IQ TUNING FOR IMPROVED IMAGE REJECTION

(75) Inventor: Meng-An Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1468 days.

(21) Appl. No.: 11/169,008

(22) Filed: Jun. 29, 2005

(65) Prior Publication Data

US 2007/0002968 A1     Jan. 4, 2007

(51) Int. Cl.
  H04L 27/36      (2006.01)
(52) U.S. Cl. ............... 375/298; 375/295; 375/219; 375/226; 375/227; 375/229; 455/109; 455/47; 455/302; 327/234
(58) Field of Classification Search ............. 375/295, 375/219, 298, 226, 227, 229; 455/109, 47, 455/302; 327/234
  See application file for complete search history.

(56) References Cited

U.S. PATENT DOCUMENTS

| | | | | |
|---|---|---|---|---|
| 3,848,243 A | * | 11/1974 | Schirmer | 340/517 |
| 4,028,703 A | * | 6/1977 | Honore et al. | 342/393 |
| 4,720,673 A | * | 1/1988 | Hatfield | 324/76.23 |
| 5,140,198 A | * | 8/1992 | Atherly et al. | 327/113 |
| 5,926,052 A | * | 7/1999 | Dow et al. | 327/234 |
| 5,978,662 A | * | 11/1999 | Swales | 455/126 |
| 6,137,852 A | * | 10/2000 | McGinn et al. | 375/375 |
| 6,137,999 A | * | 10/2000 | Lovelace et al. | 455/302 |
| 6,560,449 B1 | * | 5/2003 | Liu | 455/302 |
| 6,631,256 B2 | * | 10/2003 | Suominen | 455/302 |
| 6,959,178 B2 | * | 10/2005 | Macedo et al. | 455/313 |
| 2003/0174641 A1 | * | 9/2003 | Rahman | 370/206 |
| 2004/0037364 A1 | * | 2/2004 | Gagey et al. | 375/261 |
| 2006/0205377 A1 | * | 9/2006 | Margairaz et al. | 455/285 |

* cited by examiner

*Primary Examiner*—Shuwang Liu
*Assistant Examiner*—Michael R Neff
(74) *Attorney, Agent, or Firm*—Sterne, Kessler, Goldstein & Fox P.L.L.C.

(57) ABSTRACT

A transmitter includes a first amplifier to amplify an in-phase oscillator signal to produce an in-phase mixing signal and a second amplifier to amplify a quadrature-phase oscillator signal to produce a quadrature-phase mixing signal. A first mixer mixes the in-phase mixing signal with a first information signal to produce a first output signal. A second mixer mixes the quadrature-phase mixing signal with a second information signal to produce a second output signal. The first output signal and an inverted second output signal are summed to produce a transmitter output signal that includes an image signal caused by a phase imbalance between the in-phase and quadrature-phase mixing signals. An image monitor monitors the image signal and reduces or eliminates the phase imbalance by independently adjusting a phase of the in-phase mixing signal and/or a phase of the quadrature-phase mixing signal. Consequently, a power of the image signal is reduced or eliminated.

22 Claims, 13 Drawing Sheets

INDEPENDENT LO IQ TUNING FOR IMPROVED IMAGE REJECTION

BACKGROUND OF THE INVENTION

1. Field of the Invention

The present invention generally relates to image rejection. More specifically, the present invention provides independent tuning of in-phase and quadrature-phase local oscillator signals for improved image rejection.

2. Background Art

A generalized in-phase/quadrature-phase transmitter uses two mixers to generate a transmitter output signal. A first mixer receives a first input signal and an in-phase local oscillator signal and produces a first output signal. A second mixer receives a second input signal and a quadrature-phase local oscillator signal and produces a second output signal. The second output signal is subsequently subtracted from the first output signal to form a transmitter output signal.

The transmitter output signal includes only a main signal when a phase difference between the in-phase local oscillator signal and the quadrature-phase local oscillator is exactly equal to 90°. The transmitter output signal, however, will also include an image signal when the phase difference between the in-phase local oscillator signal and the quadrature-phase local oscillator is not exactly equal to 90°. The image signal is an undesirable signal that can interfere with the subsequent detection of the main signal. A phase imbalance between the in-phase local oscillator signal and the quadrature-phase local oscillator signal can be reduced by monitoring the image signal and iteratively adjusting the phase of either the first or second input signals to account for the oscillator phase imbalance. Such techniques, however, may suffer from significant propagation delays and settling time delays associated with adjusting the phases of the first and second input signals. Further, current techniques for reducing a phase imbalance between the in-phase and quadrature-phase local oscillator signals do not provide independent tuning of the phases of the in-phase and quadrature-phase local oscillator signals.

BRIEF SUMMARY OF THE INVENTION

Accordingly, the present invention provides independent tuning of the phases of in-phase and quadrature-phase local oscillator signals to reduce or eliminate a power of an image signal.

In one embodiment, there is provided a transmitter having a first buffer amplifier to amplify an in-phase local oscillator signal to produce an in-phase mixing signal and a second buffer amplifier to amplify a quadrature-phase local oscillator signal to produce a quadrature-phase mixing signal. The transmitter further includes a first mixer to mix the in-phase mixing signal with an in-phase information signal to produce a first output signal and a second mixer to mix the quadrature-phase mixing signal with a quadrature-phase information signal to produce a second output signal. A summer sums the first output signal and an inverted version of the second output signal to produce a transmitter output signal. The transmitter also includes an image monitor to monitor the presence of an image signal within the transmitter output signal. The image monitor independently adjusts a phase of the in-phase mixing signal or a phase of the quadrature-phase mixing signal to reduce a power of the image signal. Specifically, the image monitor adjusts capacitive loads of the first and second buffer amplifiers to adjust a phase of the in-phase and quadrature-phase mixing signals, respectively.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 10:
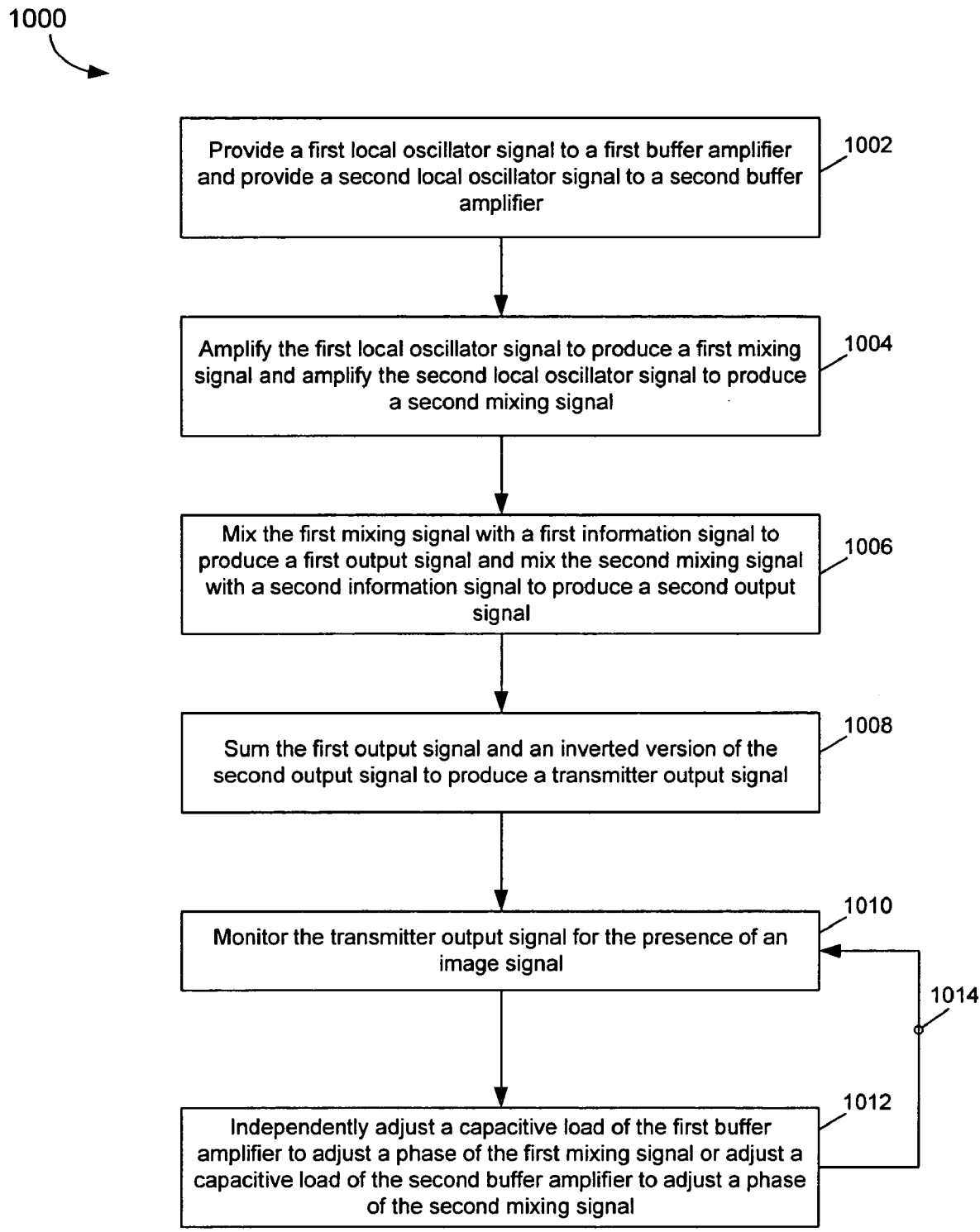

FIG. 10 provides a flowchart that illustrates operational steps for reducing a power of an image signal at the output of a wireless transmitter in accordance with the present invention.

DETAILED DESCRIPTION OF THE INVENTION

Figure 1:
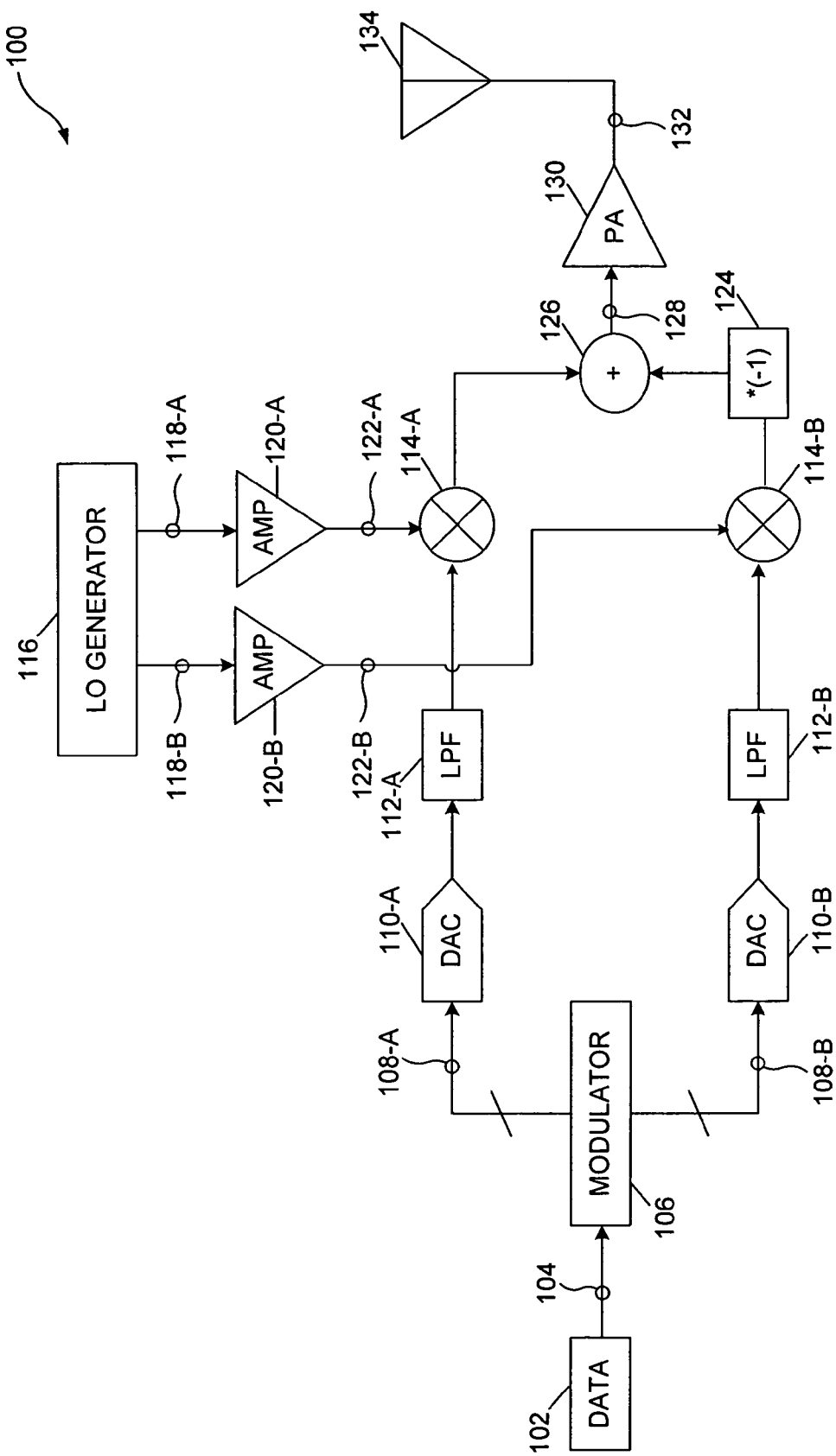
FIG. 1 illustrates a conventional wireless transmitter.

FIG. 1 illustrates a conventional wireless transmitter 100. The conventional wireless transmitter 100 includes an information source 102. The information source 102 generates a data signal 104. The data signal 104 is a sequence of bits. The information source 102 provides the data signal 104 to a conventional modulator 106. The conventional modulator 106 encodes and modulates the data signal 104 and provides two modulation channels (e.g., an in-phase channel and a quadrature-phase channel). Specifically, the conventional modulator 106 generates a modulated data signal 108-A and an associated modulated data signal 108-B. The modulated data signals 108-A and 108-B can be baseband signals or can be signals centered at an intermediate frequency (IF). The modulated data signals 108-A and 108-B can be considered to be in-phase and quadrature-phase information signals, respectively. At the output of the conventional modulator 106, the modulated data signals 108-A and 108-B are multiple-bit digital signals.

As illustrated in FIG. 1, the modulated data signals 108-A and 108-B are provided to digital-to-analog converters (DACs) 110-A and 110-B and to low-pass filters (LPFs) 112-A and 112-B, respectively. The DAC 110-A converts the modulated data signal 108-A from a digital signal into a differential analog signal. The LPF 112-A isolates an appropriate portion of the modulated data signal 108-A for transmission. Similarly, the DAC 110-B converts the modulated data signal 108-B from a digital signal to a differential analog signal and the LPF 112-B isolates an appropriate portion of the modulated data signal 108-B for transmission.

The conventional wireless transmitter 100 further includes a pair of mixers 114-A and 114-B. A first input of the mixer 114-A receives the modulated data signal 108-A and a first input of the mixer 114-B receives the modulated data signal 108-B. A conventional local oscillator (LO) generator 116 generates an in-phase LO signal 118-A and a quadrature-phase LO signal 118-B. The in-phase LO signal 118-A is provided to a buffer amplifier 120-A. The buffer amplifier 120-A amplifies the in-phase LO signal 118-A and provides an in-phase mixing signal 122-A to a second input of the mixer 114-A. Similarly, a buffer amplifier 120-B amplifies the quadrature-phase LO signal 118-B and provides a quadrature-phase mixing signal 122-B to a second input of the mixer 114-B.

The in-phase mixing signal 122-A and quadrature-phase mixing signal 122-B are typically high frequency signals. The mixer 114-A uses the in-phase mixing signal 122-A to up-convert the modulated data signal 118-A to a higher frequency. Specifically, the mixer 114-A receives the modulated data signal 108-A as a differential analog signal and produces a frequency-translated version of the modulated data signal 108-A that is also a differential analog signal. Similarly, the mixer 114-B uses the quadrature-phase mixing signal 122-B to up-convert the modulated data signal 108-B to a higher frequency. The mixer 114-B receives the modulated data signal 108-B as a differential analog signal and produces a frequency-translated version of the modulated data signal 108-B that is also a differential analog signal. Typically, the modulated data signals 108-A and 108-B are up-converted to a radio frequency (RF) by the mixers 114-A and 114-B, respectively.

As further illustrated in FIG. 1, the mixer 114-B is coupled to an inverter 124. The inverter 124 inverts the differential analog signal produced by the mixer 114-B. The output of the mixer 114-A and the output of the inverter 124 are provided to a summer 126. The summer 126 sums corresponding differential components of the differential analog signals produced by the mixer 114-A and the inverter 124. In this way, the summer 126 produces an up-converted modulated signal 128. The up-converted modulated signal 128 is a differential signal.

The summer 126 is coupled to a conventional power amplifier 130. The conventional power amplifier 130 amplifies the up-converted modulated signal 128 to produce an amplified modulated signal 132. The amplified modulated signal 132 is provided to an antenna 134 for wireless transmission. The amplified modulated signal 132 can be considered to be a transmitter output signal.

The conventional wireless transmitter 100 can be a generalized in-phase/quadrature-phase transmitter. Specifically, the conventional wireless transmitter 100 can be adapted to provide various types of modulated data signals 108-A and 108-B by implementing a variety of modulation schemes with the conventional modulator 106. Further, the conventional wireless transmitter 100 can be adapted to up-convert the modulated data signals 108-A and 108-B onto a variety of transmission channel bandwidths by altering the LPFs 112-A and 112-B and the in-phase LO signal 118-A and the quadrature-phase LO signal 118-B. Overall, the conventional wireless transmitter 100 can be modified to provide an amplified modulated signal 132 that conforms to a variety of communication protocols, standards, or known schemes.

The conventional wireless transmitter 100 can be implemented, for example, as a Institute of Electrical and Electronics Engineers (IEEE) 802.11 g transmitter. To do so, the conventional LO generator 116 generates the in-phase LO signal 118-A and the quadrature-phase LO signal 118-B to each have a frequency approximately equal to 2.4 GHz.

Figure 2:
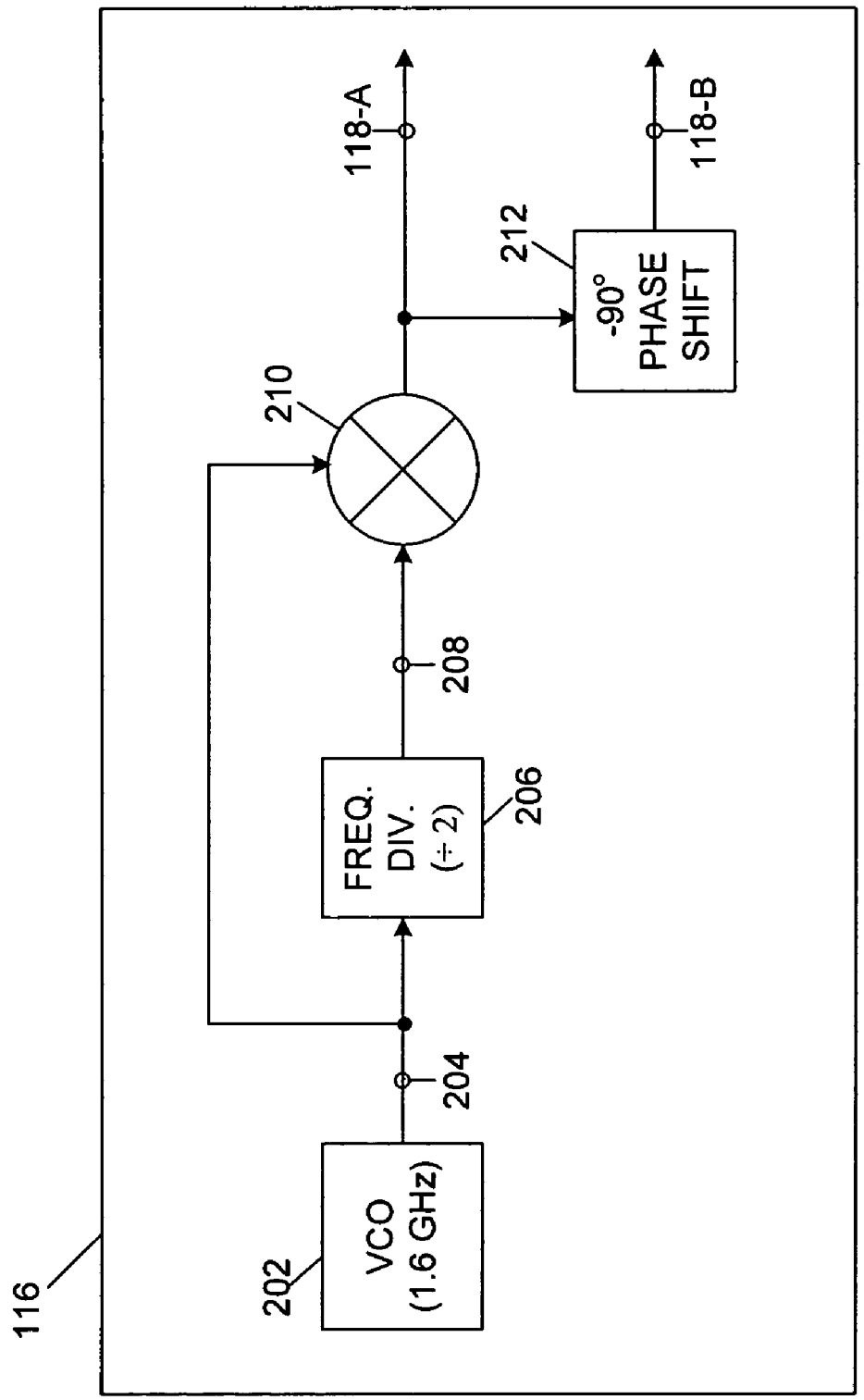
FIG. 2 illustrates a conventional local oscillator generator depicted in FIG. 1.

FIG. 2 illustrates a configuration of the conventional LO generator 116 for generation of a 2.4 GHz in-phase LO signal 118-A and a 2.4 GHz quadrature-phase LO signal 118-B. As shown in FIG. 2, the conventional LO generator 116 includes a voltage-controlled oscillator (VCO) 202. The VCO 202 generates a signal 204. The signal 204 is a periodic waveform having a frequency of approximately 1.6 GHz. The signal 204 is provided to a frequency divider 206. The frequency divider 206 reduces the frequency of the signal 204 by approximately one-half. Specifically, the frequency divider 206 produces a signal 208 having a frequency approximately equal to 800 MHz. The signal 208 and the signal 204 are provided to a mixer 210. The mixer 210 produces the in-phase LO signal 118-A having a frequency approximately equal to a sum of the frequencies of the signals 204 and 208 (i.e., approximately 2.4 GHz). A phase shifter 212 shifts the phase of the in-phase LO signal 118-A by approximately −90° to generate the quadrature-phase LO signal 118-B. The quadrature-phase LO signal 118-B also has a frequency approximately equal to 2.4 GHz.

Returning to FIG. 1, the conventional wireless transmitter 100 can operate as a single sideband transmitter. Under ideal conditions, the amplified modulated signal 132 produced by the conventional wireless transmitter 100 includes a main signal component only. Under non-ideal conditions, the amplified modulated signal 132 includes a main signal component and an image signal component. The image signal is an undesirable signal. Ideal conditions require a phase difference between the in-phase mixing signal 122-A and the quadrature-phase mixing signal 122-B to be exactly 90°. Therefore, an image signal will be present at the output of the conventional wireless transmitter 100 if the phase difference is not exactly 90°.

Any deviation from the ideal phase difference of 90° is considered to be a phase error or phase imbalance between the in-phase mixing signal 122-A and the quadrature-phase mixing signal 122-B. Generation of the in-phase LO signal 118-A and the quadrature-phase LO signal 118-B by the conventional LO generator 116 often results in a phase imbalance. The likelihood of a phase imbalance increases as the frequencies of the in-phase LO signal 118-A and the quadrature-phase LO signal 118-B are increased. Therefore, a need exists to reduce or eliminate a phase imbalance introduced by the conventional LO generator 116 during generation of the in-phase LO signal 118-A and the quadrature-phase LO signal 118-B so as to reduce or eliminate a resulting image signal.

Figure 3B:
FIG. 3B illustrates a magnitude spectrum of a modulated data signal depicted in FIG. 1.
Figure 3A:
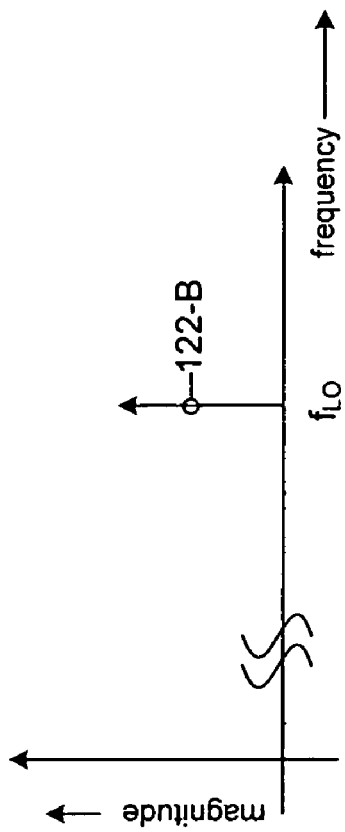
FIG. 3A illustrates a magnitude spectrum of a quadrature-phase mixing signal (or an in-phase mixing signal) depicted in FIG. 1.

FIG. 3A illustrates the magnitude spectrum of the quadrature-phase mixing signal 122-B (or the in-phase mixing signal 122-A). The quadrature-phase mixing signal 122-B ideally comprises a single tone centered at the LO frequency, fLo. As previously mentioned, the LO frequency is typically a frequency much greater than baseband. Mathematically, the quadrature-phase mixing signal 122-B can be represented as:

$$LO_Q = \sin(2\pi f_{LO} t) \quad \text{EQ. 1}$$

and the in-phase mixing signal 122-A can be represented as:

$$LO_I = \cos(2\pi f_{LO} t) \quad \text{EQ. 2}$$

FIG. 3B illustrates the magnitude spectrum of the modulated data signal 108-B (or the modulated data signal 108-A). For simplicity, the modulated data signal 108-B is depicted as comprising a single tone centered at a signal frequency, $f_{signal}$. As previously mentioned, the signal frequency is typically a relatively low frequency. When the conventional modulator 106 outputs a single tone signal, the modulated data signal 108-B can be mathematically represented as:

$$S_Q = \sin(2\pi f_{signal} t) \quad \text{EQ. 3}$$

and the modulated data signal 108-A can be represented as:

$$S_I = \cos(2\pi f_{signal} t) \quad \text{EQ. 4}$$

Equations 1 and 2 correspond to the ideal case where the phase difference between the in-phase mixing signal 122-A and the quadrature-phase mixing signal 122-B is exactly 90°. Under this scenario, the output of the summer 126 is represented as:

$$\text{Output}_{summer} = S_I \cdot LO_I - S_Q \cdot LO_Q \quad \text{EQ. 5}$$
$$= \cos(2\pi f_{signal} t)\cos(2\pi f_{LO} t) - \quad \text{EQ. 6}$$
$$\sin(2\pi f_{signal} t)\sin(2\pi f_{LO} t)$$
$$= \cos[2\pi(f_{LO} + f_{signal})t] \quad \text{EQ. 7}$$

Figure 3D:
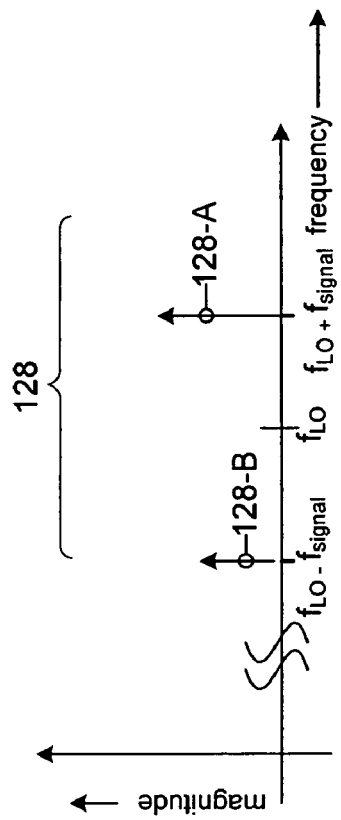
FIG. 3D illustrates the magnitude spectrum of the transmitter output signal having a main signal component and an image signal component.
Figure 3C:
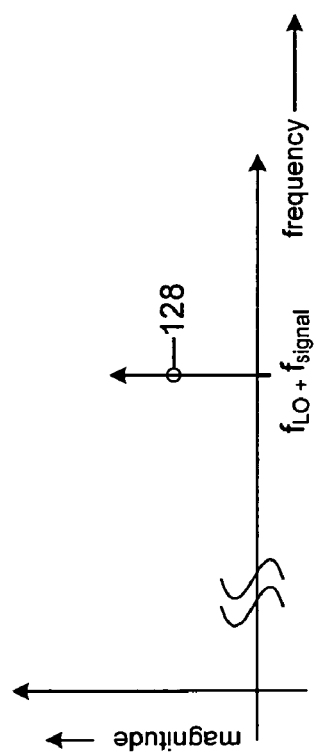
FIG. 3C illustrates a magnitude spectrum of a transmitter output signal depicted in FIG. 1 having a main signal component only.

Equation 7 shows that the output of the summer 126 comprises a main signal component only. That is, under this scenario, the output of the summer 126 does not include an image signal. FIG. 3C illustrates the magnitude spectrum of the output of the summer 126 (i.e., the up-converted modulated signal 128) when the in-phase mixing signal 122-A and the quadrature-phase mixing signal 122-B are in perfect phase quadrature.

Under non-ideal conditions, the in-phase mixing signal 122-A and the quadrature-phase mixing signal 122-B are not in perfect phase quadrature. That is, a phase imbalance exists between the in-phase mixing signal 122-A and the quadrature-phase mixing signal 122-B. To illustrate the effect of a phase imbalance, the quadrature-phase mixing signal 122-B can be represented as including a phase imbalance term as follows:

$$\hat{LO}_Q = \sin(2\pi f_{LO} t + \theta_X) \quad \text{EQ. 8}$$

As shown in equation 3, the quadrature-phase mixing signal 122-B is modeled as including a phase component $\theta_X$ that represents a deviation from the ideal phase difference of 90°. Accordingly, the output of the summer 126 under non-ideal conditions is represented as:

$$\text{Outp}\hat{u}t_{summer} = S_I \cdot LO_I - S_Q \cdot \hat{LO}_Q \quad \text{EQ. 9}$$
$$= \cos(2\pi f_{signal} t)\cos(2\pi f_{LO} t) - \quad \text{EQ. 10}$$
$$\sin(2\pi f_{signal} t)\sin(2\pi f_{LO} t + \theta_X)$$
$$= \cos[2\pi(f_{LO} + f_{signal})t] - \frac{\theta_x}{2} \cdot \quad \text{EQ. 11}$$
$$\sin[2\pi(f_{LO} - f_{signal})t]$$
$$= \text{main tone} + \text{image tone} \quad \text{EQ. 12}$$

As shown in equation 11, the output of the summer 126 comprises a main tone component and an image tone component. FIG. 3D illustrates the output of the summer 126 when a phase imbalance exists between the in-phase mixing signal 122-A and the quadrature-mixing signal 122-B. As shown in FIG. 3D, the output of the summer 126 (i.e., the up-converted modulated signal 128) comprises a main tone 128-A and an image tone 128-B.

A power of the image tone 128-B corresponds to a reduction in a power of the main tone 128-A. The conventional wireless transmitter 100 need only transmit the main tone 128-A to a corresponding wireless receiver to enable the transfer of information. Therefore, the presence of the image tone 128-B at the output of the summer 126 reduces the efficiency of the conventional wireless transmitter 100. Further, the presence of the image tone 128-B may interfere with the subsequent detection of the main tone 128-A by a corresponding wireless receiver.

Image rejection is a measure of a difference in power between the main tone 128-A and the image tone 128-B. Image rejection techniques are often used to improve modulation quality. That is, image rejection techniques are employed to reduce a power of the image tone 128-B such that, in turn, a power of the main tone 128-A may correspondingly increase. Image reduction on the order of 40 dB is often desirable to ensure the image signal does not interfere with the subsequent detection of the main signal. For the conventional wireless transmitter 100, a phase imbalance of less than 1° is required to achieve image rejection of approximately 40 dB. Therefore, image reduction techniques or phase calibration mechanisms are needed to improve transmitter signal quality by reducing or eliminating any phase imbalance between the in-phase mixing signal 122-A and the quadrature-phase mixing signal 122-B.

Figure 4:
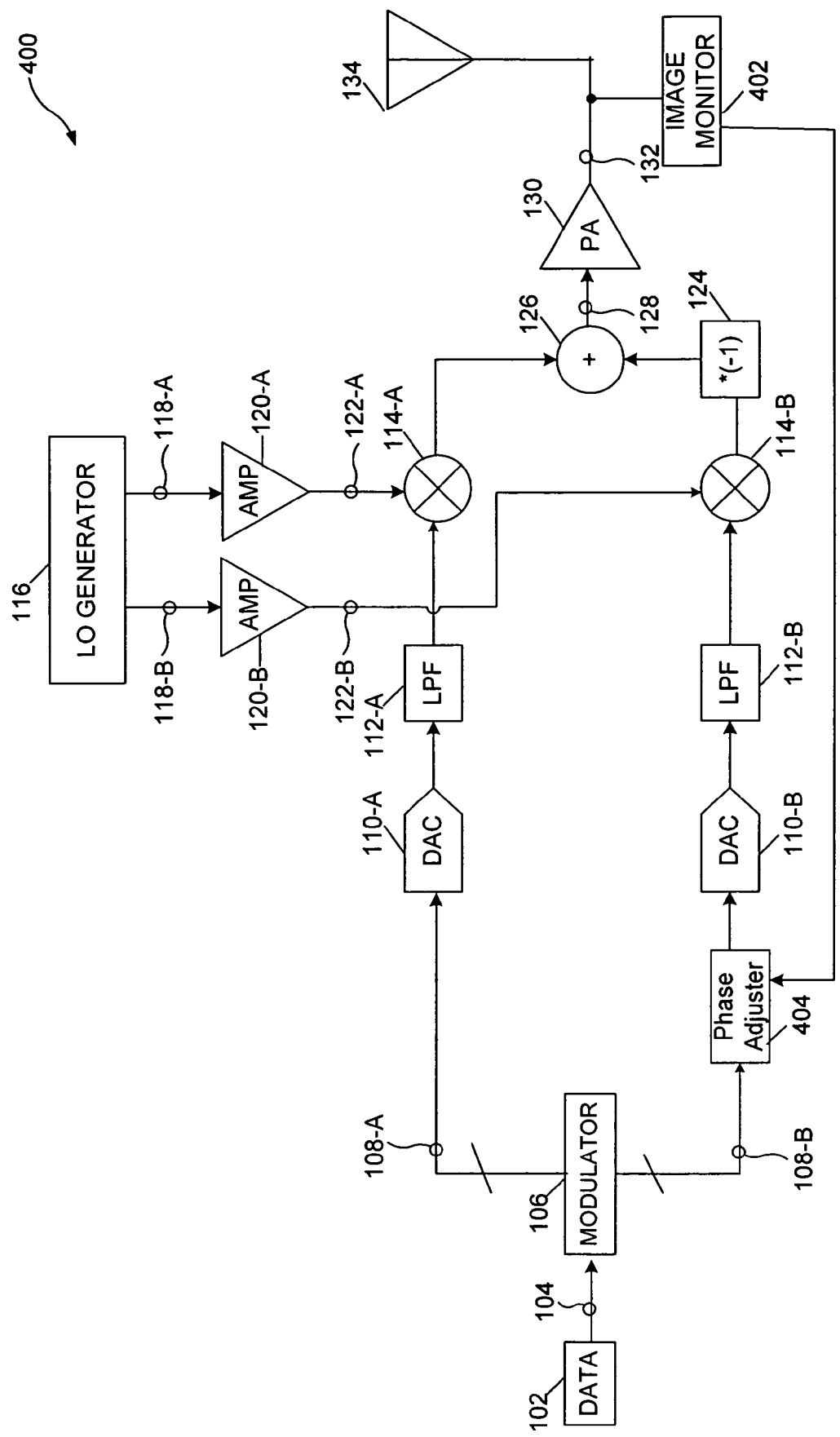
FIG. 4 illustrates a conventional wireless transmitter using a conventional image rejection technique.

FIG. 4 illustrates a conventional wireless transmitter 400 employing a conventional image rejection technique. As shown in FIG. 4, the conventional wireless transmitter 400 includes a conventional image monitor 402. The conventional image monitor 402 is coupled to quadrature-phase channel phase adjuster 404. The phase adjuster 404 can be configured to be within or part of the conventional modulator 106.

During operation, the conventional image monitor 402 monitors the output of the conventional power amplifier 130 for the presence of an image signal. The presence of an image signal at the output of the conventional power amplifier 130 alerts the conventional image monitor 402 of a phase imbalance between the in-phase mixing signal 122-A and the quadrature-phase mixing signal 122-B. Once an image signal is detected, the conventional image monitor 402 adjusts the phase of the modulated data signal 108-B by using the phase adjuster 404. Adjusting the phase of the modulated data signal 108-B introduces a phase imbalance between the modulated data signals 108-A and 108-B. The image signal can be fully rejected by making the phase imbalance between the modulated data signals 108-A and 108-B exactly equal to the phase imbalance between the in-phase mixing signal 122-A and the quadrature-phase mixing signal 122-B.

An adjustment to the phase of the modulated data signal 108-B results in an adjusted modulated data signal 108-B propagating through the quadrature-phase channel of the conventional wireless transmitter 400. An updated transmitter output signal is then produced having either an enhanced or reduced image signal. The updated image signal is again monitored by the conventional image monitor 402 and another adjustment of the phase of the modulated data signal 108-B can be made. This process is repeated until a satisfactory level of image rejection is achieved. Overall, the conventional image monitor 402 provides image rejection through successive iterations of image signal detection and phase adjustment.

The conventional image rejection technique used by the conventional wireless transmitter 400 is hampered by temporal delays associated with adjusting the phase of the modulated data signal 108-B. Specifically, the DAC 110-B and the LPF 112-B introduce significant time delays between the adjustment of the phase of the modulated data signal 108-B and the subsequent update to the amplified modulated signal 132. The DAC 110-B and the LPF 112-B need time to settle after adjusting the phase of the modulated data signal 108-B. The LPF requires a significant settling time since the LPF has a low corner frequency and therefore a long time constant. Overall, the delays introduced by the DAC 110-B and the LPF 112-B increase a time required by the conventional image monitor 402 to iteratively reduce a power of an image signal to an acceptable level.

Therefore, what is needed is an image rejection technique that reduces a time required to reduce or eliminate a power of an image signal. Specifically, an image rejection technique is needed to significantly reduce the time required to reduce a power of an image signal to an acceptable level using an iterative approach. Further, an image rejection technique that provides for the independent adjustment of the phases of the in-phase mixing signal 122-A and the quadrature-phase mixing signal 122-B is needed. An image rejection technique is also needed to provide acceptable reduction in image tone power in a simple and low cost manner.

Figure 5:
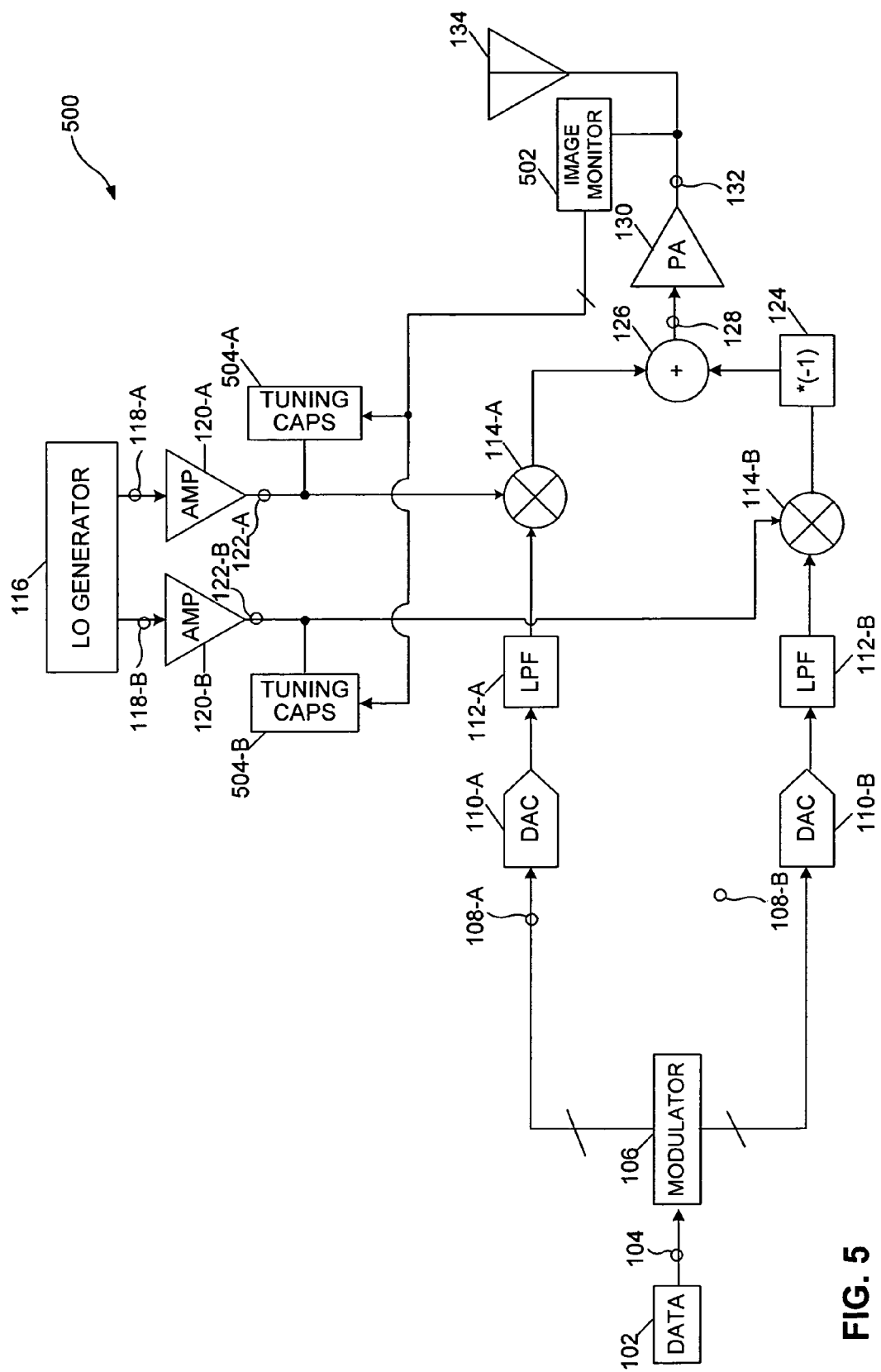
FIG. 5 illustrates a wireless transmitter having independent in-phase and quadrature-phase mixing signal phase tuning for improved image rejection according to the present invention.

FIG. 5 illustrates a wireless transmitter 500 having independent in-phase channel and quadrature-phase channel phase calibration. As shown in FIG. 5, the wireless transmitter 500 includes an image monitor 502. The image monitor 502 is coupled to the output of the conventional power amplifier 130. The image monitor 502 is also coupled to switchable tuning capacitor banks 504-A and 504-B. The tuning capacitor bank 504-A is coupled between an output of the buffer amplifier 120-A and an input of the mixer 114-A. Similarly, the tuning capacitor bank 504-B is coupled between an output of the buffer amplifier 120-B and an input of the mixer 114-B.

The tuning capacitor banks 504-A and 504-B provide adjustable capacitive loads to the buffer amplifiers 120-A and 120-B, respectively. The phase of the in-phase mixing signal 122-A can be adjusted by varying the capacitive load of the buffer amplifier 120-A. Likewise, the phase of the quadrature-phase mixing signal 122-B can be adjusted by varying the capacitive load of the buffer amplifier 120-B. During operation of the wireless transmitter 500, the image monitor 502 monitors the output of the conventional power amplifier 130 for the presence of an image signal. If an image signal is detected, the image monitor 502 can independently adjust the capacitive loads of the buffer amplifiers 120-A and 120-B to minimize or eliminate the power of the image signal. The image monitor 502 can include a power detector for measuring a power of the image signal.

The independent in-phase channel and quadrature-phase channel phase calibration provided by the present invention enables independent adjustment of the phases of the in-phase and quadrature-phase mixing signals 122-A and 122-B. Further, the independent in-phase channel and quadrature-phase channel phase calibration provided by the present invention minimizes the time delays associated with phase adjustments made by the image monitor 502. Specifically, phase adjustments to reduce a power of an image signal are made directly at the inputs of the mixers 114-A and 114-B. The present invention provides independent in-phase channel and quadrature-phase channel phase calibration using a low complexity design that can be realized with few additional components and minimal increased costs.

Figure 6:
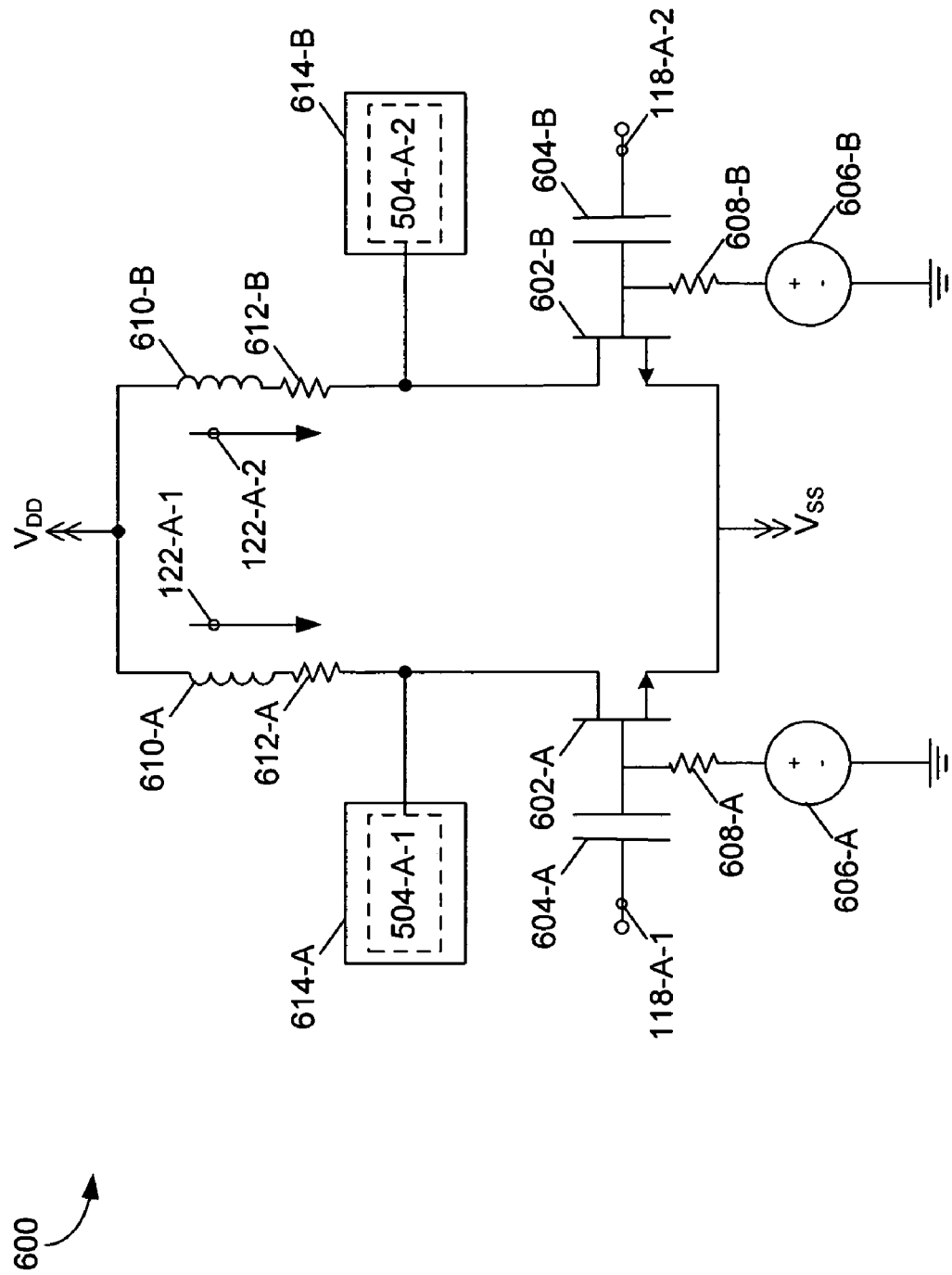
FIG. 6 illustrates a differential amplifier used to implement a buffer amplifier depicted in FIG. 5.

FIG. 6 illustrates a differential amplifier 600 used to implement the buffer amplifier 120-A (or the buffer amplifier 120-B). For purposes of this discussion, the differential amplifier 600 will be described as a possible configuration of the buffer amplifier 120-A. It should be noted, however, that the configuration and operation of the buffer amplifier 120-B mimics that of the buffer amplifier 120-A.

The differential amplifier 600 includes a pair of transistors 602-A and 602-B. The pair of transistors 602-A and 602-B are each Field-Effect Transistors (FETs). The sources of the FETs 602-A and 602-B are connected together and coupled to a voltage supply $V_{SS}$. $V_{SS}$ typically provides a relatively low or negative voltage or, alternatively, is a ground.

The gates of the FETs 602-A and 602-B are AC coupled to the in-phase LO signal 118-A (shown differentially as 118-A-1 and 118-A-2) through capacitors 604-A and 604-B, respectively. The gates of the FETs 602-A and 602-B are DC coupled to constant voltage sources 606-A and 606-B through bias resistors 608-A and 608-B, respectively. The constant voltage sources 606-A and 606-B, in conjunction with the bias resistors 608-A and 608-B, are used to bias the FETs 602-A and 602-B by applying a desired gate-source voltage to the FETs 602-A and 602-B. A gain of the differential amplifier 600 can be adjusted by adjusting the biasing of the differential amplifier 600.

As further shown in FIG. 6, the drains of the FETs 602-A and 602-B are coupled to a voltage supply $V_{DD}$. Specifically, the drains of the FETs 602-A and 602-B are coupled to the voltage supply $V_{DD}$ through an inductive winding. Inductors 610-A and 610-B model the inductance of the inductive winding. Further, resistors 612-A and 612-B model a parasitic resistance of the inductive winding.

The differential amplifier 600 is configured as a voltage controlled current source. In effect, the differential amplifier 600 behaves as a transconductance device by converting an input voltage signal into an output current signal. Specifically, the differential amplifier 600 receives the in-phase LO signals 118-A-1 and 118-A-2 as a differential voltage signal pair and produces the in-phase mixing signal 122-A (shown differentially as 122-A-1 and 122-B-1) as a differential current signal pair. The in-phase mixing signals 122-A-1 and 122-A-2, as differential current signals, are applied to loads 614-A and 614-B of the differential amplifier 600, respectively, and converted back to differential voltage signals. The tuning capacitor bank 504-A (shown as tuning capacitor banks 504-A-1 and 504-A-2) provides a portion of the loads 614-A and 614-B.

Figure 7:
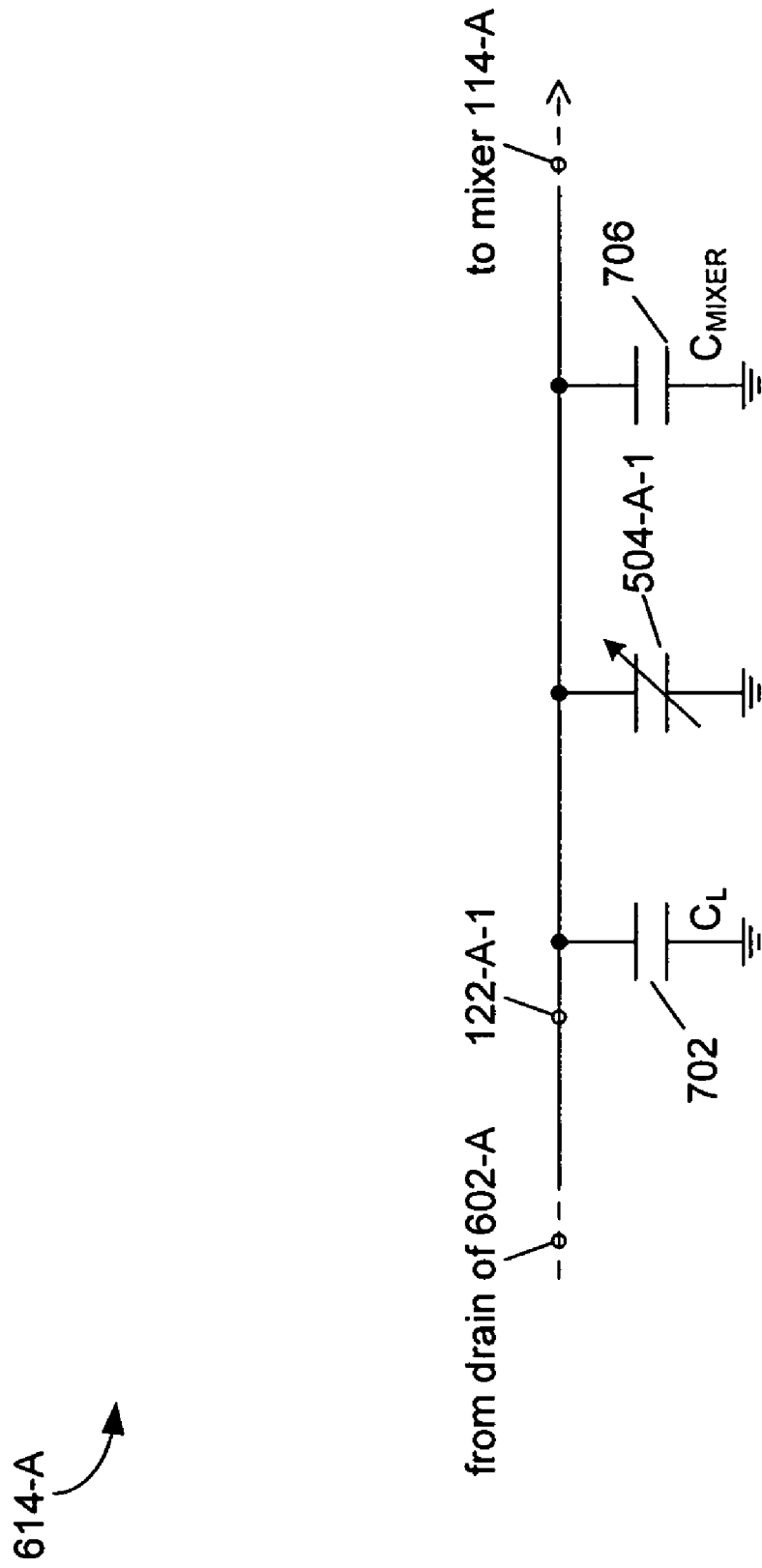
FIG. 7 illustrates components of a load coupled to an output of the differential amplifier depicted in FIG. 6.

FIG. 7 illustrates the load 614-A coupled to the drain of the FET 602-A. It should be noted that the configuration and operation of the load 614-B mimics that of the load 614-A. As shown in FIG. 7, the load 614-A includes a capacitor 702, the tuning capacitor bank 504-A-1 and a capacitor 706. The load 614-A is further coupled to the mixer 114-A as the output of the load 614-A provides one component of the differential in-phase mixing signal 122-A (shown as 122-A-1) to the mixer 114-A.

The capacitor 702 models a parasitic capacitance of the inductive winding connecting the drain of the FET 602-A to the voltage supply $V_{DD}$. The capacitor 706 models a load capacitance from the mixer 114-A. The tunable capacitor bank 504-A-1 provides an adjustable capacitive load. The capacitive load provided by the tunable capacitor bank 504-A-1 is adjusted by the image monitor 502. The phase of the in-phase mixing signal 122-A-1 can be adjusted by tuning the tunable capacitor bank 504-A-1. The image monitor 502 can adjust the capacitive load applied to the second differential component of the in-phase mixing signal 122-A (i.e., 122-A-2) in a similar manner to ensure that the phases of differential components 122-A-1 and 122-A-2 are aligned. In this way, the image monitor 502 can adjust the phase of the in-phase mixing signal 122-A (or the phase of the quadrature-phase mixing signal 122-B). In turn, the power of an image signal produced by a phase imbalance between the in-phase mixing signal 122-A and the quadrature-phase mixing signal 122-B can be reduced or eliminated.

Figure 8A:
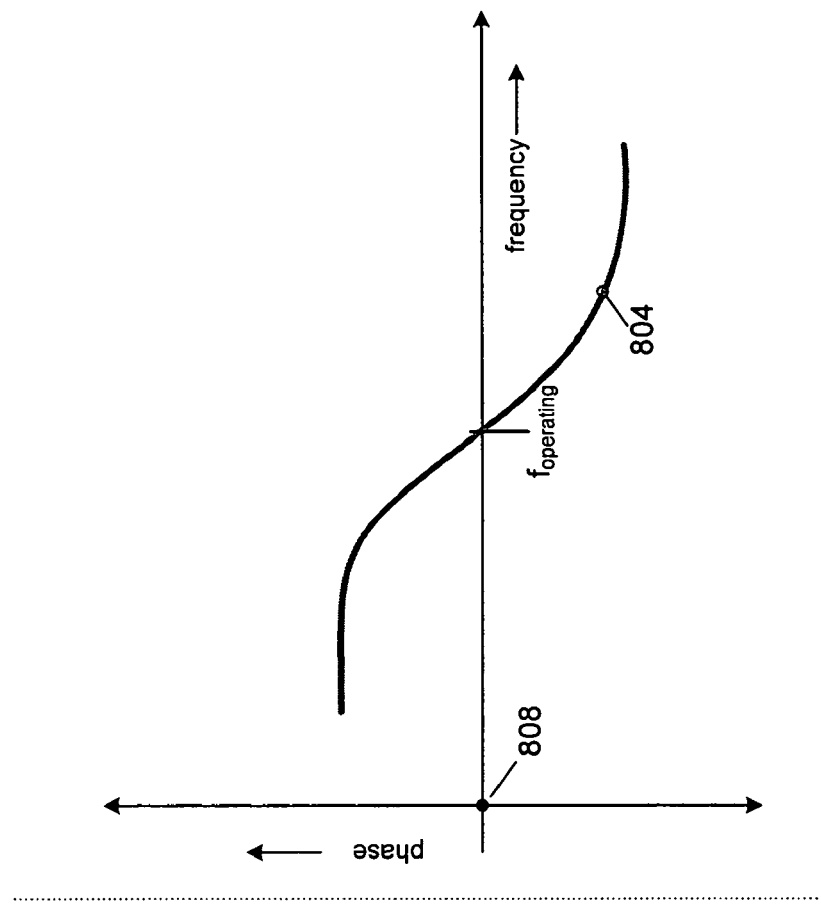
FIG. 8A illustrates a magnitude response and a phase response of an in-phase mixing signal depicted in FIG. 7 when an initial capacitive load is applied to the output of the differential amplifier depicted in FIG. 6.
Figure 8A:
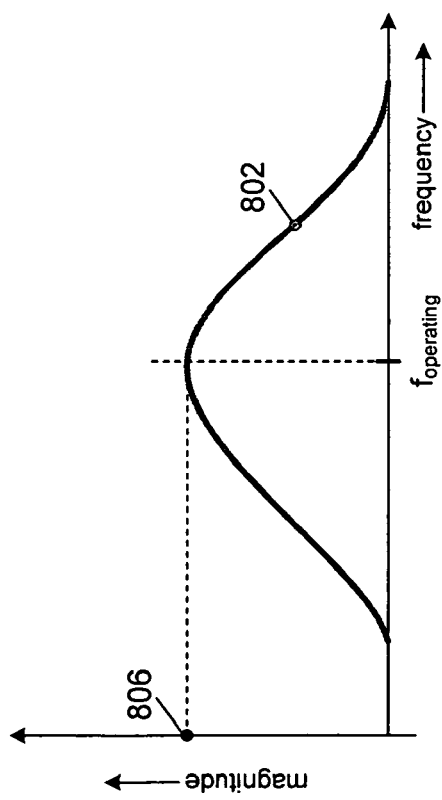
Figure 8B:
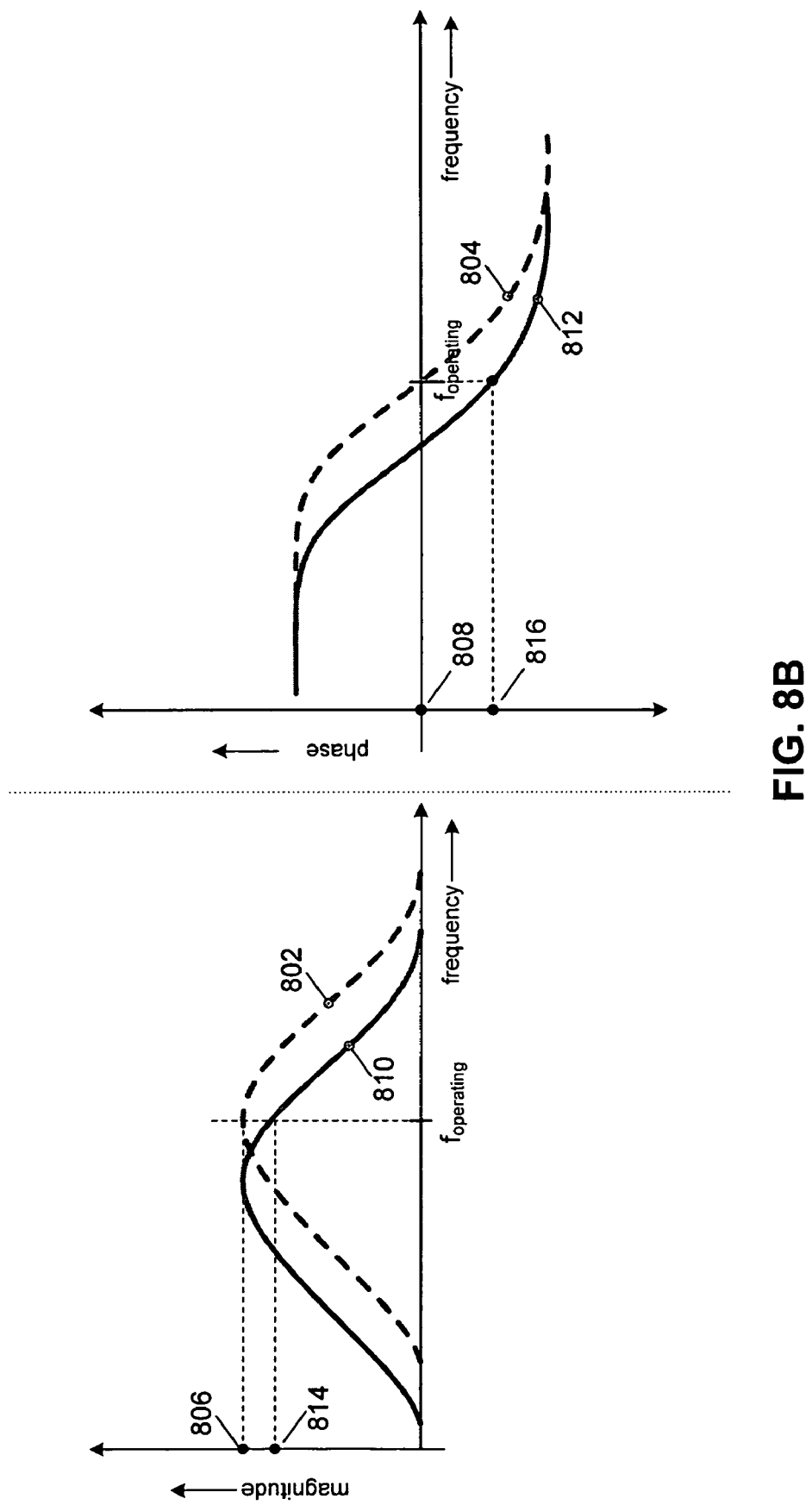
FIG. 8B illustrates a magnitude response and a phase response of the in-phase mixing signal when the initial capacitive load is increased.
Figure 8C:
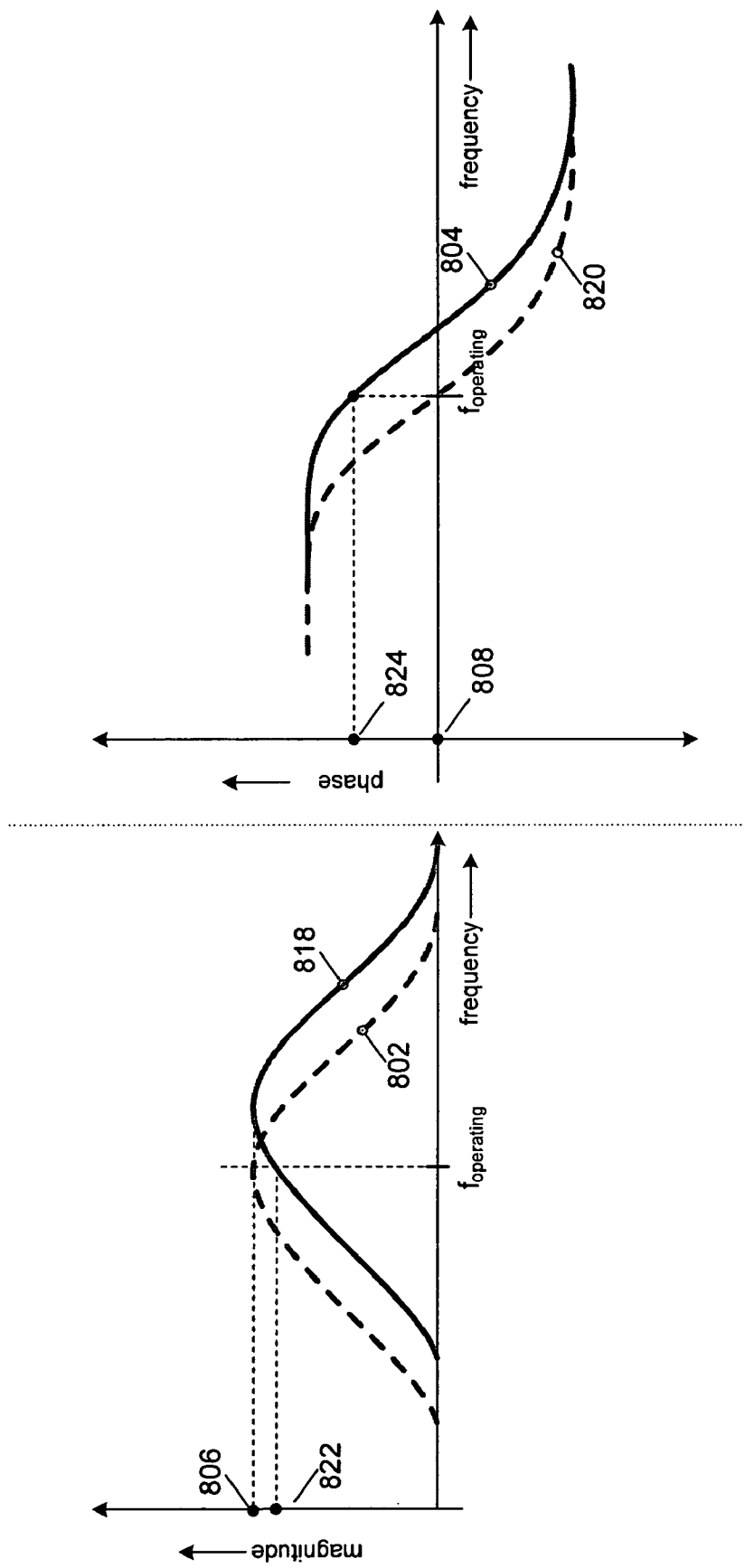
FIG. 8C illustrates a magnitude response and a phase response of the in-phase mixing signal when the initial capacitive load is decreased.

FIGS. 8A, 8B and 8C illustrate the adjustment of the phase of the in-phase mixing signal 122-A-1 by tuning the tunable capacitor bank 504-A-1. Specifically, FIG. 8A illustrates a magnitude response 802 and a phase response 804 of the in-phase mixing signal 122-A-1 when a start-up or steady-state capacitance of the load 614-A is applied to the drain of the FET 602-A. That is, FIG. 8A depicts the magnitude response 802 and the phase response 804 of the in-phase mixing signal 122-A-1 when the tunable capacitor bank 504-A-1 provides a steady-state or initial capacitive load in addition to a nominal capacitance provided by the capacitors 702 and 704.

As shown in FIG. 8A, the magnitude of the in-phase mixing signal 122-A-1 is at a maximum at a point 806. The maximum magnitude at the point 806 corresponds to the operating frequency of the differential amplifier 600. Further, the phase of the in-phase mixing signal 122-A-1 is approximately equal to 0° at a point 808 at the operating frequency of the differential amplifier 600.

FIG. 8B illustrates a magnitude response 810 and a phase response 812 when the capacitive load provide by the tunable capacitor bank 504-A-1 is increased from its initial value depicted in FIG. 8A. The magnitude response 810 is shown in comparison to the magnitude response 802 and the phase response 812 is shown in comparison to the phase response 804. As shown in FIG. 8B, the magnitude response 810 is shifted downward with respect to the magnitude response 802. The magnitude response 810 has a value indicated by a point 814 at the operating frequency of the wireless transmitter 500. The point 814 is lower than the point 806 of the magnitude response 802. Therefore, increasing the capacitive load of the tunable capacitor bank 504-A-1 reduces the magnitude of the in-phase mixing signal 122-A-1.

As further shown in FIG. 8B, the phase response 812 is shifted behind the phase response 804. That is, the phase response 812 lags behind the phase response 804. The phase of the in-phase mixing signal 122-A-1 at the operating frequency of the wireless transmitter 500 is indicated by a point 816. The phase of the in-phase mixing signal 122-A-1, as indicated by the point 816, is therefore decreased when the capacitive load provided by the tunable capacitor bank 504-A-1 is increased.

FIG. 8C illustrates a magnitude response 818 and a phase response 820 when the capacitive load provide by the tunable capacitor bank 504-A-1 is decreased from its initial value depicted in FIG. 8A. The magnitude response 818 is shown in comparison to the magnitude response 802 and the phase response 820 is shown in comparison to the phase response 804. As shown in FIG. 8C, the magnitude response 818 is shifted upward with respect to the magnitude response 802. The magnitude response 818 has a value indicated by a point 822 at the operating frequency of the wireless transmitter 500. The point 822 is lower than the point 806 of the magnitude response 802. Therefore, decreasing the capacitive load of the tunable capacitor bank 504-A-1 reduces the magnitude of the in-phase mixing signal 122-A-1.

As further shown in FIG. 8C, the phase response 820 is shifted ahead of the phase response 804. That is, the phase response 820 leads the phase response 804. The phase of the in-phase mixing signal 122-A-1 at the operating frequency of the wireless transmitter 500 is indicated by a point 824. The phase of the in-phase mixing signal 122-A-1, as indicated by the point 824, is therefore increased when the capacitive load provided by the tunable capacitor bank 504-A-I is decreased.

FIGS. 8A-8C show that the phase of the in-phase mixing signal 122-A-1 can be adjusted by varying the capacitive load provided by the tunable capacitor bank 504-A-1. Specifically, the phase of the in-phase mixing signal 122-A-1 can be decreased by increasing the capacitive load provided by the tunable capacitor bank 504-A-1 and the phase of the in-phase mixing signal 122-A-1 can be increased by decreasing the capacitive load provided by the tunable capacitor bank 504-A-1. Further, FIGS. 8B and 8C show that, at the operating frequency of the wireless transmitter 500, the magnitude of the in-phase mixing signal 122-A-1 decreases as the phase of the in-phase mixing signal 122-A-1 is increased or decreased. The gain of the differential amplifier 600 can be increased to offset this corresponding decrease in the magnitude of the in-phase mixing signal 122-A-1.

Figure 9:
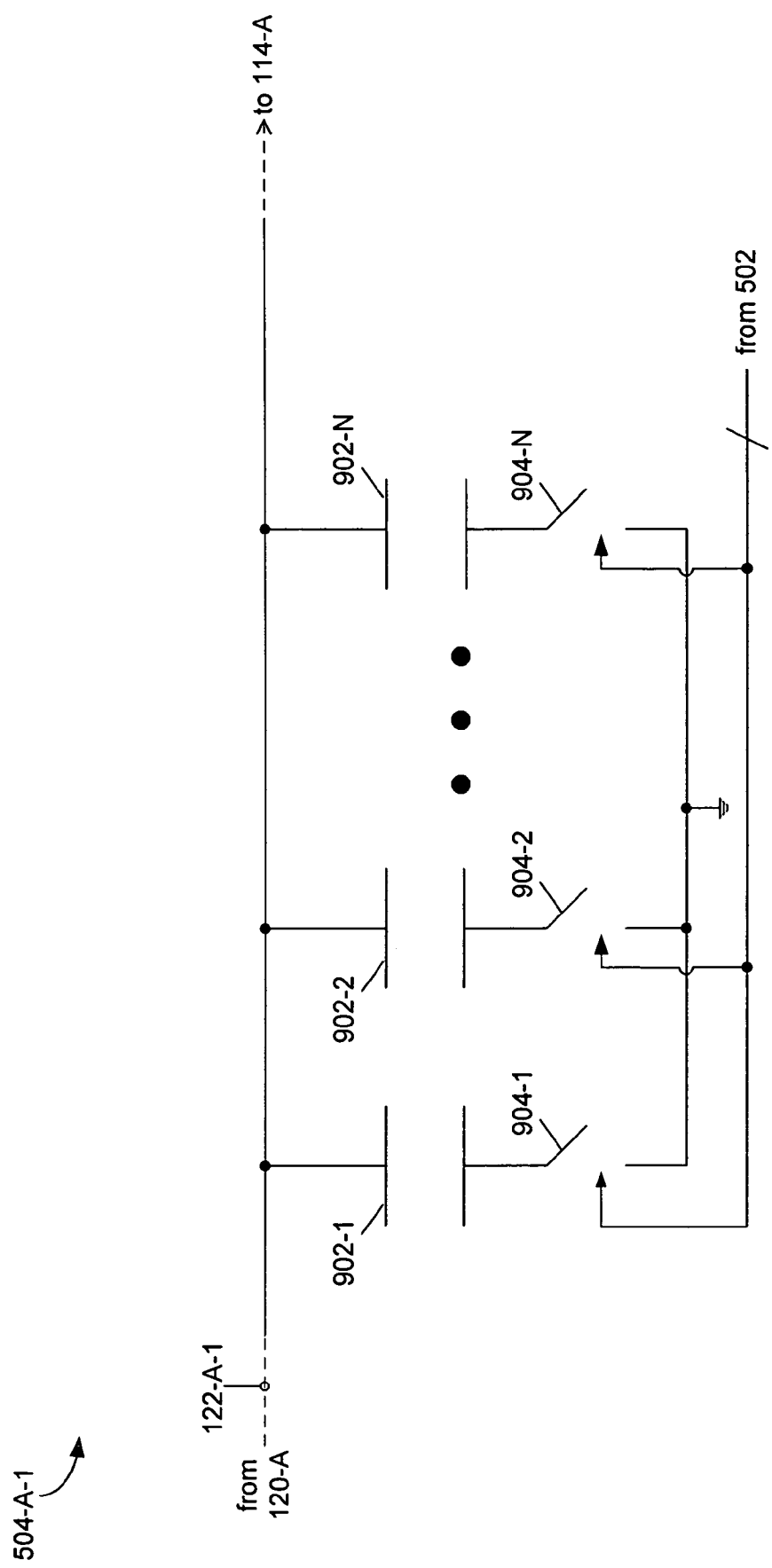
FIG. 9 illustrates a portion of a tuning capacitor bank depicted in FIG. 5.

FIG. 9 illustrates a configuration of the tunable capacitor bank 504-A-1 that is used to adjust the phase of the in-phase mixing signal 122-A-1. As shown in FIG. 9, the tuning capacitor bank 504-A-1 is coupled between a differential output of the buffer amplifier 120-A and a first input of the mixer 114-A. The tunable capacitor bank 504-A-2 (not shown in FIG. 9) is used to adjust the phase of a second differential component of the in-phase mixing signal 122-A (i.e., the in-phase mixing signal 122-A-2). It should be noted that the configuration and operation of the tunable capacitor bank 504-B mimics that of the tunable capacitor bank 504-A. That is, the tunable capacitor bank 504-B includes a tunable capacitor bank 504-B-1 (not shown in FIG. 9) and a tunable capacitor bank 504-B-2 (not shown in FIG. 9) to adjust the phases of the differential components of the quadrature-phase mixing signal 122-B. Specifically, the tunable capacitor bank 504-B-1 adjusts a first differential component of the quadrature-phase mixing signal 122-B and the tunable capacitor bank 504-B-2 adjusts a second differential component of the quadrature-phase mixing signal 122-B.

The tuning capacitor bank 504-A-1 includes a number of capacitors 902-1 through 902-N. Each of the capacitors 902-1 through 902-N is coupled between a differential output of the buffer amplifier 120-A and a ground by corresponding switches 904-1 through 904-N. The switches 904-1 through 904-N are controlled by the image monitor 502. The image monitor 502 activates one or more of the switches 904-1 through 904-N to decrease a phase of the in-phase mixing signal 122-A-1. The image monitor 502 deactivates one or more of the switches 904-1 through 904-N to increase a phase of the in-phase mixing signal 122-A-1. Activating one or more of the switches 904-1 through 904-N correspondingly increases the capacitive load of an output of the buffer amplifier 120-A. Deactivating one or more of the switches 904-1 through 904-N correspondingly decreases the capacitive load of an output of the buffer amplifier 120-A.

The value of the capacitors 902-1 through 902-N can be varied. For example, the capacitors 902-1 through 902-N can be similarly-valued capacitors, differently-valued capacitors or binary ratio capacitors. The phase change experienced by the in-phase mixing signal 122-A-1 therefore depends on the change in the number of the capacitors 902-1 through 902-N activated by the image monitor 502 during an iterative adjustment. For example, during an iterative adjustment, the image monitor can either activate, deactivate or maintain the current operating state of any of the capacitors 902-1 through 904-N. Through the use of periodic or aperiodic iterative adjustments to the tuning capacitor bank 504-A-1 (and the tuning capacitor bank 504-A-2), the image monitor 502 can adjust the phase of the in-phase mixing signal 122-A to reduce or eliminate a phase imbalance between the in-phase mixing signal 122-A and the quadrature-phase mixing signal 122-B. In a similar manner, the tuning capacitor bank 504-B can adjust the phase of the quadrature-phase mixing signal 122-B to reduce or eliminate a phase imbalance between the in-phase mixing signal 122-A and the quadrature-phase mixing signal 122-B. The present invention therefore provides a mechanism to achieve maximum imgae rejection through the independent adjustment of the phases of the in-phase mixing signal 122-A and the quadrature-phase mixing signal 122-B.

FIG. 10 provides a flowchart 1000 that illustrates operational steps for reducing a power of an image signal at the output of a wireless transmitter in accordance with the present invention. The invention is not limited to this operational description. Rather, it will be apparent to persons skilled in the relevant art(s) from the teachings herein that other operational control flows are within the scope and spirit of the present invention. In the following discussion, the steps in FIG. 10 are described.

At step 1002, an first oscillator signal is provided to a first buffer amplifier and a second local oscillator signal is provided to a second buffer amplifier. Typically, the first local oscillator signal and the second local oscillator signal are of the same frequency. Further, the first local oscillator signal and the second local oscillator can be generated by a local oscillator generator such that the second local oscillator signal is a phase-shifted version of the first local oscillator signal. For example, the second local oscillator can be shifted by approximately −90° with respect to the first local oscillator signal.

At step 1004, the first buffer amplifier amplifies the first local oscillator signal and the second buffer amplifier amplifies the second local oscillator signal. Specifically, the first buffer amplifier outputs a first mixing signal and the second buffer amplifier outputs a second mixing signal.

At step 1006, the first mixing signal is mixed with a first information signal to produce a first output signal. Further, the second mixing signal is mixed with a second information signal to produce a second output signal. The first and second information signals can be in phase quadrature. The first and second output signals can be generated as radio frequency signals.

At step 1008, an inverted version of the second output signal is added to the first output signal to produce a transmitter output signal. Corresponding differential components of the first and inverted second output signals can be added together to generate the transmitter output signal. The resulting transmitter output signal can be provided to an antenna for wireless transmission.

At step 1010, the transmitter output signal is monitored for the presence of an image signal. An image monitor can be used to detect the presence of an image signal within the transmitter output signal. Further, the image monitor can measure a power of the image signal and determine if the power of the image signal exceeds a specified or predetermined threshold.

At step 1012, a capacitive load of the first buffer amplifier is adjusted independently of an adjustment to a capacitive load of the second buffer amplifier. Adjusting the capacitive load of the first buffer amplifier adjusts a phase of the first mixing signal. The phase of the first mixing signal is increased when the capacitive load of the first buffer amplifier is decreased. The phase of the first mixing signal is decreased when the capacitive load of the first buffer amplifier is increased. Adjusting the capacitive load of the second buffer amplifier adjusts a phase of the second mixing signal. The phase of the second mixing signal is increased when the capacitive load of the second buffer amplifier is decreased. The phase of the second mixing signal is decreased when the capacitive load of the second buffer amplifier is increased.

The capacitive loads of the first and second buffer amplifiers can be adjusted by adding or removing tuning capacitors to the outputs of the first and second buffer amplifiers, respectively. The capacitive loads of the first and second buffer amplifiers can be adjusted independently. The capacitive loads coupled to each differential component of the output of the first or second buffer amplifiers, however, can be adjusted similarly.

The phase of the first mixing signal can be adjusted such that a difference between a phase of the first mixing signal and a phase of the second mixing signal is approximately equal to 90°, thereby reducing a power of the image signal. Alternatively, the phase of the second mixing signal can be adjusted such that the difference between the phase of the first mixing signal and the phase of the second mixing signal is approximately equal to 90°, thereby reducing the power of the image signal. Adjustments to the phases of the first and second mixing signals can also be made at the same time.

Step 1014 depicts the iterative monitoring and phase adjustment operation provided by the present invention. Specifically, step 1014 shows that the present invention provides a method for continuously monitoring the power of the image signal accompanied by a subsequent adjustment of the phase of the first mixing signal and/or phase of the second mixing signal. Together, steps 1010 through 1014 depict a method of iteratively adjusting the phase of the first mixing signal and/or phase of the second mixing signal in order to reduce or eliminate a phase imbalance between the first and second mixing signals. This iterative process can be implemented whenever the image signal is detected or, alternatively, if the power of the image signal exceeds a predetermined threshold.

Overall, the present invention provides the independent tuning of in-phase and quadrature-phase mixing signals to reduce or eliminate the power of an image signal. The independent tuning provided by the present invention enables the quick adjustment of the phases of the in-phase and quadrature-phase mixing signals. Specifically, the phases of the in-phase and quadrature-phase mixing signals can be adjusted such that a time required for the adjustments to be realized at the output of a transmitter is reduced. Further, the present invention provides a low cost system for implementing independent tuning of in-phase and quadrature-phase mixing signals.

It will be apparent to persons skilled in the relevant art(s) from the teachings herein that the present invention is not limited to the examples provided in the forgoing description.

That is, the spirit and scope of the present invention supports modifications and adjustment of the examples provided herein so that the present invention is applicable to, for example, single channel transmitters, multiple channel transmitters, single channel receivers, multiple channel receivers, or other coherent detection systems.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A method for reducing a power of an image signal in a transmitter output signal, comprising:
    providing a first local oscillator signal to a first buffer amplifier to produce a first mixing signal and providing a second local oscillator signal to a second buffer amplifier to produce a second mixing signal;
    mixing a first input signal with the first mixing signal to produce a first output signal and mixing a second input signal with the second mixing signal to produce a second output signal;
    summing the first output signal and an inverted version of the second output signal to produce the transmitter output signal, wherein the transmitter output signal includes the image signal;
    detecting the image signal in the transmitter output signal; and
    adjusting a phase of at least one mixing signal based on the power of the image signal such that a difference between a phase of the first mixing signal and a phase of the second mixing signal is approximately equal to 90°, wherein adjusting the phase of the first mixing signal comprises adjusting a capacitive load of the first buffer amplifier based on the power of the image signal.

2. The method of claim 1, wherein the providing step further comprises generating the first local oscillator signal from a signal produced by a voltage controlled oscillator.

3. The method of claim 2, wherein the providing step further comprises generating the second local oscillator signal from the first local oscillator signal by shifting a phase of the first local oscillator signal.

4. The method of claim 1, wherein the detecting step further comprises measuring the power of the image signal.

5. The method of claim 1, wherein adjusting the capacitive load of the first buffer amplifier comprises increasing the capacitive load of the first buffer amplifier to decrease the phase of the first mixing signal.

6. The method of claim 5, wherein increasing the capacitive load of the first buffer amplifier comprises coupling one or more tuning capacitors to an output of the first buffer amplifier.

7. The method of claim 1, wherein adjusting the capacitive load of the first buffer amplifier comprises decreasing the capacitive load of the first buffer amplifier to increase the phase of the first mixing signal.

8. The method of claim 7, wherein decreasing the capacitive load of the first buffer amplifier comprises decoupling one or more tuning capacitors from an output of the first buffer amplifier.

9. The method of claim 1, wherein adjusting the phase of the second mixing signal comprises adjusting a capacitive load of the second buffer amplifier.

10. The method of claim 9, wherein adjusting the capacitive load of the second buffer amplifier comprises increasing the capacitive load of the second buffer amplifier to decrease the phase of the second mixing signal.

11. The method of claim 10, wherein increasing the capacitive load of the second buffer amplifier comprises coupling one or more tuning capacitors to an output of the second buffer amplifier.

12. The method of claim 9, wherein adjusting the capacitive load of the second buffer amplifier comprises decreasing the capacitive load of the second buffer amplifier to increase the phase of the second mixing signal.

13. The method of claim 12, wherein decreasing the capacitive load of the second buffer amplifier comprises decoupling one or more tuning capacitors from an output of the second buffer amplifier.

14. A transmitter, comprising:
    a first buffer amplifier to amplify a first local oscillator signal to produce a first mixing signal;
    a second buffer amplifier to amplify a second local oscillator signal to produce a second mixing signal;
    a first mixer to mix the first mixing signal with a first input signal to produce a first output signal;
    a second mixer to mix the second mixing signal with a second input signal to produce a second output signal;
    a summer to sum the first output signal and an inverted version of the second output signal to produce a transmitter output signal, wherein the transmitter output signal includes an image signal; and
    an image monitor to measure a power of the image signal, wherein the image monitor independently adjusts a phase of at least one mixing signal based on the power of the image signal such that a difference between a phase of the first mixing signal and a phase of the second mixing signal is approximately equal to 90°, wherein adjusting the phase of the first mixing comprises adjusting a capacitive load of the first buffer amplifier based on the power of the image signal.

15. The transmitter of claim 14, further comprising:
    a first capacitor bank coupled to an output of the first buffer amplifier; and
    a second capacitor bank coupled to an output of the second buffer amplifier.

16. The transmitter of claim 15, wherein the image monitor adjusts the phase of the first mixing signal by coupling or decoupling one or more tuning capacitors of the first capacitor bank to the output of the first buffer amplifier.

17. The transmitter of claim 16, wherein each of the one or more tuning capacitors of the first capacitor bank are coupled between the output of the first buffer amplifier and a ground by a corresponding switch.

18. The transmitter of claim 15, wherein the image monitor adjusts the phase of the second mixing signal by coupling or decoupling one or more tuning capacitors of the second capacitor bank to the output of the second buffer amplifier.

19. The transmitter of claim 18, wherein each of the one or more tuning capacitors of the second capacitor bank are coupled between the output of the second buffer amplifier and a ground by a corresponding switch.

20. The method of claim 1, wherein adjusting the phase of at least one mixing signal based on the power of the image signal, includes the steps of:
    adjusting the phase of the first mixing signal by a first amount based on the power of the image signal, and adjusting the phase of the second mixing signal by a second amount based on the power of the image signal, such that the difference between the phase of the first mixing signal and the phase of the second mixing signal is approximately equal to 90°, so as to reduce the power of the image signal.

21. The transmitter of claim 14, wherein the image monitor independently adjusts the phase of the first mixing signal and the phase of the second mixing signal based on the power of the image signal, such that the difference between the phase of the first mixing signal and the phase of the second mixing signal is approximately equal to 90°.

22. A transmitter, comprising:
   a first buffer amplifier to amplify a first local oscillator signal to produce a first mixing signal;
   a second buffer amplifier to amplify a second local oscillator signal to produce a second mixing signal;
   a first mixer to mix the first mixing signal with a first input signal to produce a first output signal;
   a second mixer to mix the second mixing signal with a second input signal to produce a second output signal;
   a summer to sum the first output signal and an inverted version of the second output signal to produce a transmitter output signal, wherein the transmitter output signal includes an image signal; and
   an image monitor to measure a power of the image signal, wherein the image monitor independently adjusts a phase of at least one mixing signal based on the power of the image signal wherein adjusting the phase of the first mixing signal comprises adjusting a capacitive load of the first buffer amplifier based on the power of the image signal.

* * * * *